United States Patent
Isoda et al.

(10) Patent No.: US 9,627,560 B2
(45) Date of Patent: Apr. 18, 2017

(54) RADIOGRAPHIC IMAGE DETECTOR

(71) Applicant: Konica Minolta, Inc., Tokyo (JP)

(72) Inventors: Kei Isoda, Hino (JP); Masashi Kondo, Hachioji (JP); Tadashi Arimoto, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/177,916

(22) Filed: Jun. 9, 2016

(65) Prior Publication Data

US 2016/0372611 A1   Dec. 22, 2016

(30) Foreign Application Priority Data

Jun. 16, 2015  (JP) .................... 2015-120956

(51) Int. Cl.
*H01L 31/024* (2014.01)
*H01L 27/146* (2006.01)

(52) U.S. Cl.
CPC ...... *H01L 31/024* (2013.01); *H01L 27/14658* (2013.01); *H01L 27/14676* (2013.01)

(58) Field of Classification Search
CPC ......... H01L 2924/0002; H01L 2924/00; H01L 27/146; H01L 27/14618; H01L 31/024; H01L 27/14658; H01L 27/14676

USPC .......................................... 257/428
See application file for complete search history.

(56) References Cited

U.S. PATENT DOCUMENTS

| | | | | |
|---|---|---|---|---|
| 9,035,263 B2* | 5/2015 | Iwata | .................... | G01T 1/2018 250/366 |
| 2010/0001195 A1* | 1/2010 | Konkle | ................. | G01T 1/2018 250/370.09 |
| 2011/0198505 A1* | 8/2011 | Ishida | .................... | G01T 1/202 250/363.01 |
| 2014/0353509 A1* | 12/2014 | Nakatsugawa | ....... | G01T 1/2018 250/361 R |

FOREIGN PATENT DOCUMENTS

| | | |
|---|---|---|
| JP | 2012231825 A | 11/2012 |
| JP | 2014092447 A | 5/2014 |

* cited by examiner

*Primary Examiner* — Mark R Gaworecki
*Assistant Examiner* — Taeho Jo
(74) *Attorney, Agent, or Firm* — Lucas & Mercanti, LLP

(57) ABSTRACT

A radiographic image detector includes a phosphor layer, a heat shield layer, and a photoelectric converter in this order, wherein the heat shield layer has a thickness T (μm) and a thermal conductivity C (W/m·K) satisfying that C/T is from 0.004 to 5.

10 Claims, 3 Drawing Sheets

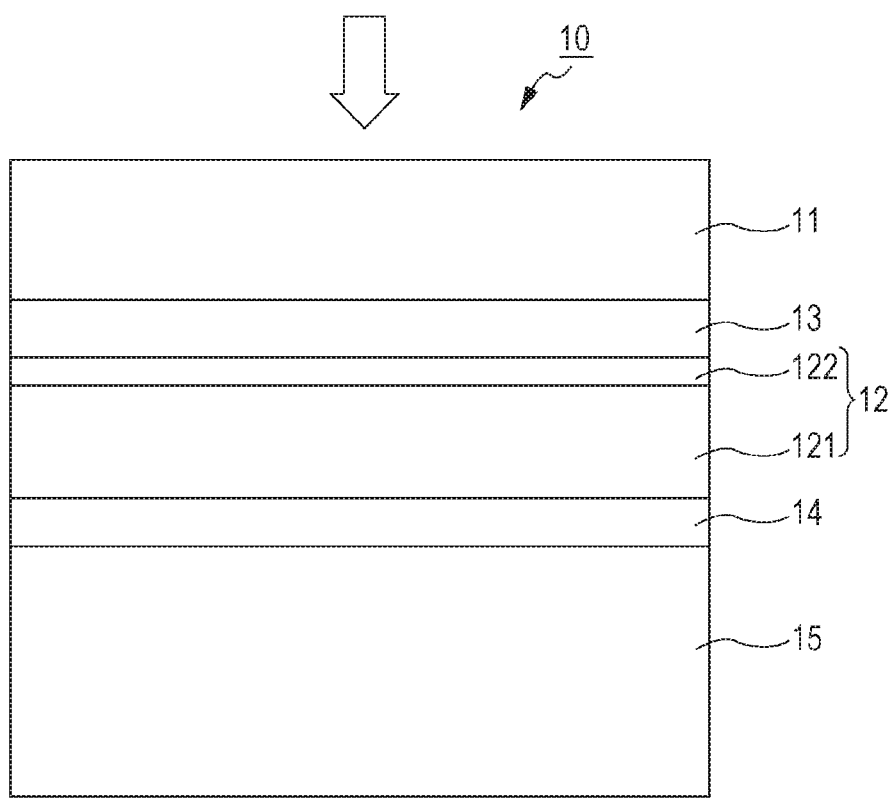

RADIOGRAPHIC IMAGE DETECTOR

The entire disclosure of Japanese Patent Application No. 2015-120956 filed on Jun. 16, 2015 including description, claims, drawings, and abstract are incorporated herein by reference in its entirety.

BACKGROUND OF THE INVENTION

Field of the Invention

The present invention relates to a radiographic image detector capable of suppressing temperature quenching of the scintillator, which is associated with temperature rise, and also capable of suppressing unevenness in the in-plane brightness of the image.

Description of the Related Art

In recent years, digital radiographic image detectors such as computed radiography (CR) systems and flat panel detectors (FPDs), which allow directly obtaining digital radiographic images and directly displaying images on image displays such as cathode-ray tubes and liquid crystal panels, are widely used for diagnostic imaging in hospitals, clinics, and other places. Recently, a flat panel using a cesium iodide (CsI)-containing scintillator layer in combination with thin film transistors (TFTs) has attracted attention as a high-sensitivity X-ray image visualizing system.

The CsI scintillator has a problem in that the amount of emitted light decreases with increasing temperature. This is considered to be because of an increase in the influence of a phenomenon in which when electron-hole pairs generated in scintillator crystals by X-ray irradiation undergo recombination to emit light, an increase in thermal energy causes electron-hole pairs not to emit light upon recombination but to give thermal energy to the crystals, namely, an increase in the influence of temperature quenching. FPDs, which generally have a heat source such as an electric circuit in the case, also have a problem in that they are potentially more easily heated than CRs without such a heat source.

There is a problem in that such temperature quenching causes a reduction in the amount of the light emitted by the scintillator. In addition, there is another problem in that local variations in the thermal energy applied to the scintillator occur depending on the location and other conditions of the heat source in the case, so that variations occur in the amount of emitted light in the plane of the panel (brightness unevenness). In order to eliminate brightness unevenness, correction by calibration or the like may be used. However, the thermal energy generated from the heat source can randomly change depending on the use conditions, and correction is impossible in some case, which raises a problem.

The problem of the heat in FPD panels has already been discussed, for example, in JP 2014-092447 A and JP 2012-231825 A.

JP 2014-092447 A discloses that a high thermal conductivity case is provided together with a gap provided between the case and a scintillator-semiconductor photodetector unit so that the output from the semiconductor photodetector (corresponding to the TFTs in the present invention) for detecting light generated from the scintillator can be stabilized regardless of the surrounding temperature.

JP 2012-231825 A discloses that an anisotropically thermally conductive plate having thermal conduction anisotropy in a specific direction is provided in a case so that variations in temperature can be made less likely to occur in the detection plane of a detection panel (corresponding to the TFTs in the present invention and the semiconductor photodetector in JP 2014-092447 A).

Both patent documents disclose a member for facilitating heat dissipation or thermal conduction (the case or the anisotropically thermally conductive plate). JP 2014-092447 A discloses that a gap is provided as a measure to suppress sudden thermal conduction or local variations in thermal energy. However, these measures are not based on an idea for suppressing the phenomenon of heat transfer from a heat source such as a circuit board to a scintillator. Therefore, even when these measures are used, an unacceptable reduction in the amount of emitted light from a scintillator or unacceptable variations in brightness can occur depending on the situation where a heat source generates heat.

SUMMARY OF THE INVENTION

It is therefore an object of the present invention to suppress temperature quenching, which is associated with an increase in the temperature of a scintillator, and variations in the in-plane brightness of an image by preventing heat from transferring to the scintillator when the heat is generated from an electric circuit or other components in an FPD.

Under these circumstances, the inventors have conducted an intensive study assuming that not only electric circuits but also TFTs can generate heat. As a result, the inventors have accomplished the present invention based on the finding that the problems can be solved by providing a heat shield layer with specific heat-shielding properties between a scintillator and a TFT circuit board. The present invention has the following features.

[1] To achieve the abovementioned object, according to an aspect, a radiographic image detector reflecting one aspect of the present invention comprises a phosphor layer, a heat shield layer, and a photoelectric converter in this order, wherein the heat shield layer has a thickness T (μm) and a thermal conductivity C (W/m·K) satisfying that C/T is from 0.004 to 5.

[2] The radiographic image detector according to Item. 1, wherein C/T is preferably from 0.004 to 0.7.

[3] The radiographic image detector according to Item. 1, wherein C/T is preferably from 0.004 to 0.14.

[4] The radiographic image detector according to any one of Items. 1 to 3, wherein the heat shield layer preferably has a thermal conductivity C of at most 5 (W/m·K).

[5] The radiographic image detector according to Item. 4, wherein the heat shield layer preferably has a thermal conductivity C of at most 0.7 (W/m·K).

[6] The radiographic image detector according to Item. 4, wherein the heat shield layer preferably has a thermal conductivity C of at most 0.14 (W/m·K).

[7] The radiographic image detector according to any one of Items. 1 to 6, which preferably has an $A_{TP}/A_P$ ratio of 1.5 to 75, wherein $A_P$ represents the area of a section of the phosphor layer, wherein the section is perpendicular to the direction of incidence of radioactive rays, and $A_{TP}$ represents the contact area between the heat shield layer and the phosphor layer.

[8] The radiographic image detector according to any one of Items. 1 to 7, wherein the heat shield layer preferably comprises a hot melt resin as a main component.

[9] The radiographic image detector according to Item. 8, wherein the hot melt resin preferably comprises at least one selected from a polyolefin resin, an ethylene-vinyl acetate copolymer, and an acrylic resin.

[10] The radiographic image detector according to any one of Items. 1 to 9, which is preferably capable of detecting an image at a rate of at least one per second.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein:

FIG. 3 is a schematic diagram showing an example of a radiographic image detector according to an embodiment of the present invention.

DESCRIPTION OF THE PREFERRED EMBODIMENTS

Hereinafter, an embodiment of the present invention will be described with reference to the drawings. However, the scope of the invention is not limited to the illustrated examples.

A radiographic image detector according to an embodiment of the present invention includes a phosphor layer, a heat shield layer, and a photoelectric converter in this order.

Figure 1:
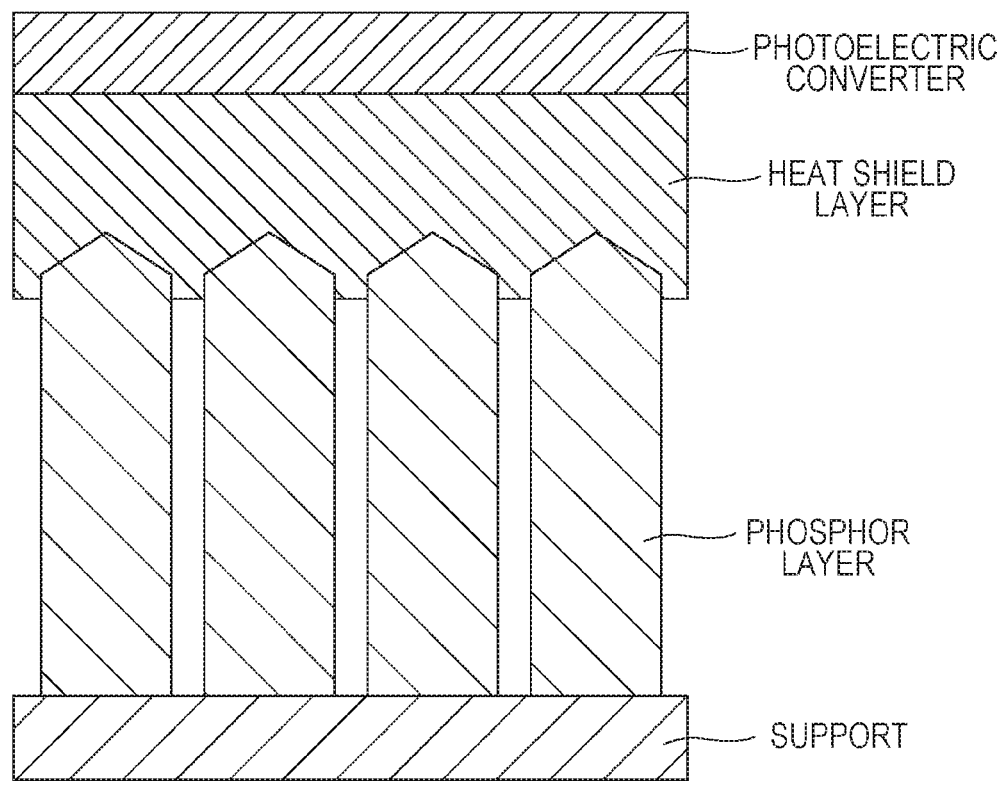
FIG. 1 is a schematic cross-sectional view showing a radiographic image detector according to an embodiment of the present invention.

FIG. 1 shows the basic structure of the radiographic image detector according to the present invention.

Figure 2:
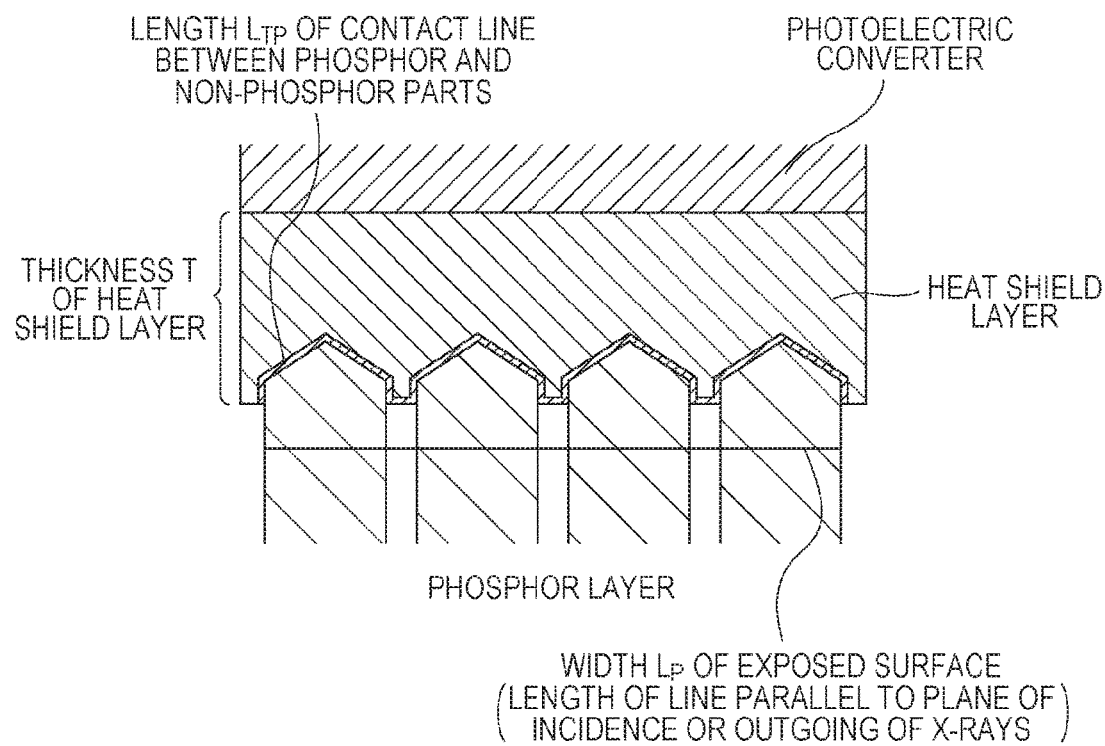
FIG. 2 is a schematic diagram showing the thickness and the contact area in the radiographic image detector.

As shown in FIG. 1, the radiographic image detector according to the present invention has a heat shield layer between a phosphor layer as a component of a scintillator and a photoelectric converter. In a more specific embodiment, as shown in FIG. 2, the radiographic image detector according to the present invention may further include an additional layer such as an adhesion layer 13 between a support 11 and a phosphor layer 12. Such a radiographic image detector 10 is configured to output image data in the form of electrical signals by using a combination of a photoelectric converter 15 panel and other components. In the present invention, a heat shield layer 14 is provided between the photoelectric converter 15 and the phosphor layer 12.

Hereinafter, each component will be described in turn.

Support 11

In the radiographic image detector 10 according to the present invention, the support 11 is used as a foundation on which a phosphor 120 is deposited to form the phosphor layer 12. The support 11 also has the function of maintaining the structure of the phosphor layer 12. In some cases, however, the support is not essential.

Examples of the material for the support 11 include materials transparent to radioactive rays such as X-rays, such as various types of glass, polymer materials, and metals.

Specific examples of the material that may be used to form the support 11 include quartz, sheet glass such as borosilicate glass or chemically reinforced glass; ceramics such as sapphire, silicon nitride, and silicon carbide; semiconductors such as silicon, germanium, gallium arsenide, gallium phosphorus, and gallium nitrogen; polymer films (plastic films) such as cellulose acetate films, polyester films, polyethylene terephthalate films, polyamide films, polyimide films, triacetate films, polycarbonate films, and carbon fiber-reinforced resin sheets; metal sheets such as aluminum sheets, iron sheets, and copper sheets, or metal sheets having a coating layer of an oxide of any of these metals; and bio-nanofiber films. Any of these materials may be used alone or used to be stacked.

A polymer film having flexibility is preferred among the materials for the support 11.

As used herein, the term "having flexibility" refers to having an elastic modulus (E120) of 0.1 to 300 GPa at 120° C. The "elastic modulus" is the value obtained by calculating the slope of stress against strain in a region where the strain indicated by the reference line on the sample according to JIS C 2318 has a linear relationship with the corresponding stress in the measurement using a tensile tester. This value is called the Young's modulus. In the description, the elastic modulus is defined as the Young's modulus.

Such a polymer film may be a film made of polyethylene terephthalate, polyethylene naphthalate, cellulose acetate, polyamide, polyimide, polyether imide, epoxy resin, polyamide imide, bismaleimide resin, fluororesin, acrylic resin, polyurethane, aramid, nylon, polycarbonate, polyphenylene sulfide, polyether sulfone, polysulfone, polyether ether ketone, liquid crystal polymer, or bio-nanofibers.

A resin film including polyimide is preferred in view of heat resistance during vapor deposition of a phosphor on the resin film. The polymer film may also be a commercially available product such as UPILEX-125S (manufactured by Ube Industries, Ltd.).

The polymer film preferably has a thickness of 20 to 1,000 μm, more preferably 50 to 750 μm. The support with a thickness of 50 μm or more has good handleability after the phosphor layer is formed thereon. When the support has a thickness of 750 μm or less, functional layers such as an adhesion layer, a conductive layer, and an adhesion promoting layer can be easily processed by roll-to-roll processing, which is very useful in terms of productivity improvement.

For example, in order to control the reflectivity, the support 11 may further include a light shield layer and/or a light-absorbing pigment layer in addition to the layer made of the material mentioned above, or the property of absorbing or reflecting light may be imparted to the support itself, or the above material itself may be colored.

The light shield layer or the pigment layer may be separately provided on the film.

Phosphor Layer 12

The phosphor layer has the function of converting the energy of X-rays, which are radioactive rays incident from the outside, into visible light.

As used herein, the term "phosphor" refers to a fluorescent material capable of emitting light when ionizing radiation such as α-rays, γ-rays, or X-rays are applied to excite the atoms. In other words, it refers to a fluorescent material capable of converting radioactive rays into ultraviolet or visible light and emitting the light. The phosphor may be any material capable of efficiently converting, into light, the energy of radioactive rays, such as X-rays, incident from the outside. In addition, radioactive rays do not always have to be instantly converted into light, and an alternative method may be used which includes temporarily storing the light as a latent image in the phosphor layer and then reading out the latent image later.

In the present invention, for example, the phosphor may be any appropriate material capable of converting radioactive rays such as X-rays into rays with a different wavelength, such as visible rays. Specific examples of the phosphor may include the scintillators and phosphors shown from page 284 to page 299 of Keikotai Handbook (Handbook of Phosphor) (edited by Phosphor Research Society. The Electrochemical Society of Japan, published by Ohmsha, Ltd., 1987) and the materials shown on the web home page of the U.S. Lawrence Berkeley National Laboratory (Scintillation Properties (http://scintillator.lbl.gov/)). It will be understood, however, that even though not shown herein, any material capable of converting radioactive rays such as X-rays into rays with a different wavelength, such as visible rays may be used for the phosphor particles.

Specific examples of the composition of the phosphor include the following.

A first example is a metal halide phosphor represented by basic composition formula (I):

$$M^{I}X \cdot aM^{II}X'_2 \cdot bM^{III}X''_3 : zA$$

In the formula, $M^{I}$ represents an element capable of turning into a monovalent cation, specifically, at least one selected from the group consisting of lithium (Li), sodium (Na), potassium (K), rubidium (Rb), cesium (Cs), thallium (Tl), silver (Ag), and other elements.

$M^{II}$ represents an element capable of turning into a divalent cation, specifically, at least one selected from the group consisting of beryllium (Be), magnesium (Mg), calcium (Ca), strontium (Sr), barium (Ba), nickel (Ni), copper (Cu), zinc (Zn), cadmium (Cd), and other elements.

$M^{III}$ represents at least one selected from the group consisting of scandium (Sc), yttrium (Y), aluminum (Al), gallium (Ga), indium (In), and lanthanoids.

X, X', and X" each represent a halogen element. X, X', and X" may represent the same or different elements.

A represents at least one element selected from the group consisting of Y, Ce, Pr, Nd, Sm, Eu, Gd, Tb, Dy, Ho, Er, Tm, Yb, Lu, Na, Mg, Cu, Ag (silver), Tl, and Bi (bismuth).

The letters a, b, and z each independently represent a value in the range expressed by $0 \leq a < 0.5$, $0 \leq b < 0.5$, or $0 < z < 1.0$.

Another example is a rare earth-activated metal fluoride halide phosphor represented by basic composition formula (II):

$$M^{II}FX : zLn$$

In the formula, $M^{II}$ represents at least one alkaline earth metal element, Ln represents at least one lanthanoid, X represents at least one halogen element, and z represents a value satisfying $0 < z \leq 0.2$.

A further example is a rare earth oxysulfide phosphor represented by basic composition formula (III):

$$Ln_2O_2S : zA$$

In the formula, Ln represents at least one lanthanoid, A represents at least one element selected from the group consisting of Y, Ce, Pr, Nd, Sm, Eu, Gd, Tb, Dy, Ho, Er, Tm, Yb, Lu, Na, Mg, Cu, Ag (silver), Tl, and Bi (bismuth), and z represents a value satisfying $0 < z < 1$.

$Gd_2O_2S$, in which gadolinium (Gd) is used as the Ln element, is particularly preferred because it is known to have high emission properties in the most detectable wavelength region for the photodetector when terbium (Tb) or dysprosium (Dy) is used as the A element.

A further example is a metal sulfide phosphor represented by basic composition formula (IV):

$$M^{II}S : zA$$

In the formula, $M^{II}$ represents an element capable of turning into a divalent cation, specifically, at least one element selected from the group consisting of alkaline earth metals, zinc (Zn), strontium (Sr), gallium (Ga), and other elements, A represents at least one element selected from the group consisting of Y, Ce, Pr, Nd, Sm, Eu, Gd, Tb, Dy, Ho, Er, Tm, Yb, Lu, Na, Mg, Cu, Ag (silver), Tl, and Bi (bismuth), and z represents a value satisfying $0 < z < 1$.

A further example is an oxometallate phosphor represented by basic composition formula (V):

$$M_a(AG)_b : zA$$

In the formula, M represents a metal element capable of turning into a cation, (AG) represents at least one oxo acid group selected from the group consisting of phosphate, borate, silicate, sulfate, tungstate, and aluminate, and A represents at least one element selected from the group consisting of Y, Ce, Pr, Nd, Sm, Eu, Gd, Tb, Dy, Ho, Er, Tm, Yb, Lu, Na, Mg, Cu, Ag (silver), Tl, and Bi (bismuth).

The letters a and b each represent any value possible depending on the valence of the metal and the oxo acid group, and z represents a value satisfying $0 < z < 1$.

A further example is a metal oxide phosphor represented by basic composition formula (VI):

$$M_aO_b : zA$$

In the formula, M represents a metal element capable of turning into a cation, which is at least one selected from those listed above for any one of $M^{I}$ to $M^{II}$.

The letters a and b each represent any value possible depending on the valence of the metal and the oxo acid group, and z represents a value satisfying $0 < z < 1$.

A further example is a metal oxyhalide phosphor represented by basic composition formula (VII):

$$LnOX : zA$$

In the formula, Ln represents at least one lanthanoid, A represents at least one element selected from the group consisting of Y, Ce, Pr, Nd, Sm, Eu, Gd, Tb, Dy, Ho, Er, Tm, Yb, Lu, Na, Mg, Cu, Ag (silver), Tl, and Bi (bismuth), and z represents a value satisfying $0 < z < 1$.

In the present invention, the phosphor layer 12 generally includes a phosphor parent compound and an activator. The phosphor layer 12 preferably includes phosphor columnar crystals formed by vapor phase deposition. More preferably, the degree of orientation of crystal planes with a specific plane index in the phosphor columnar crystals is in the range of 80 to 100% based on an X-ray diffraction spectrum regardless of the site in the direction of the thickness of the phosphor layer from the near-substrate bottom region of the phosphor columnar crystals. The vapor phase deposition may be heating vapor deposition, sputtering, CVD, ion plating, or other methods. Heating vapor deposition is particularly preferred.

In the present invention, when the phosphor layer includes columnar crystals, the degree of orientation is more preferably in the range of 95 to 100%. The specific plane index is preferably (200) although it may be any one of (100), (110), (111), (200), (211), (220), (311), and other indices (as for the plane indices, see X-Sen Kaiseki Nyumon (Introduction to X-ray Analysis), TOKYO KAGAKU DOZIN CO., LTD, pages 42-46). In this case, an independent columnar structure is obtained even on the substrate side of the columnar crystals, which can suppress the scattering of light components generated in the phosphor, so that light can be efficiently emitted to the photoelectric converter. In the present invention, the degree of orientation of crystal planes with a specific plane index based on an X-ray diffraction spectrum refers to the ratio of the intensity Ix of the specific plane index to the total intensity I of all the plane indices including other plane indices. For example, the degree of orientation of the (200) plane with an intensity of $I_{200}$ in an X-ray diffraction spectrum is $I_{200}/I$. The method of identifying and measuring the plane index to determine the degree of orientation may be, for example, X-ray diffraction (XRD). X-ray diffraction is a highly versatile analytical technique in which information for the identification of substances and about the structure of crystal phases can be obtained by using diffraction satisfying the Bragg equation, which occurs when characteristic X-rays with a specific wavelength are applied to crystalline substances. Cu, Fe, Co, or the like is used as the target in the irradiation system, and the power during the irradiation is generally about 0 to 50 mA and 0 to 50 kV although it depends on the system performance.

In the present invention, the phosphor layer 12 may be composed of a single layer or two or more sublayers. The phosphor layer 12 may be made of a phosphor layer alone. Alternatively, the phosphor layer 12 may have a layered structure including an underlying sublayer 122 and a phosphor sublayer 121 stacked in this order on the support 11. When the phosphor layer 12 includes two sublayers including an underlying sublayer and a phosphor sublayer, these sublayers may be made of the same or difference materials as long as they include the same phosphor parent compound. Specifically, the phosphor layer 12 may be a single layer entirely consisting of a phosphor parent material or may be a single layer entirely including a phosphor parent compound and an activator, or the phosphor layer 12 may be composed of an underlying sublayer consisting of a phosphor parent compound and a phosphor sublayer including the phosphor parent compound and an activator or may be composed of an underlying sublayer including a phosphor parent compound and a first activator and a phosphor sublayer including the phosphor parent compound and a second activator.

In the present invention, preferred examples of the phosphor layer 12 include one consisting of a phosphor layer including a phosphor parent compound and an activator; and one including a phosphor sublayer and an underlying sublayer each including a phosphor parent compound and an activator.

The relative content of the activator in the underlying sublayer is preferably 0.01 to 1% by mole, more preferably 0.1 to 0.7% by mole. In particular, the relative content of the activator in the underlying sublayer is preferably 0.01% by mole or more in view of the improvement of the emission brightness of the scintillator panel 10 and the storage stability of the scintillator panel 10. In addition, it is very preferable that the relative content of the activator in the underlying sublayer should be lower than that in the phosphor sublayer. The molar ratio of the relative content of the activator in the underlying sublayer to that of the activator in the phosphor sublayer ((the relative content of the activator in the underlying sublayer)/(the relative content of the activator in the phosphor sublayer)) is preferably 0.1 to 0.7.

A preferred mode of the method of forming the phosphor layer includes the steps of forming an underlying sublayer on the surface of a substrate and forming a phosphor sublayer on the surface of the underlying layer by vapor phase deposition, wherein the underlying sublayer has a porosity lower than that of the phosphor sublayer so that the above requirements for the plane index can be satisfied. As used herein, the term "porosity" refers to the ratio of the area of pores to the sum of the area of pores and the cross-sectional area of the phosphor constituting the phosphor sublayer in a cross-section obtained by cutting the phosphor sublayer parallel to the support. The porosity can be determined by a process that includes cutting the phosphor layer of a scintillator panel parallel to the support, taking a scanning electron micrograph of the resulting cross-section, and binarizing the phosphor part and the pore part in the micrograph using image processing software. In this regard, the thickness of the phosphor layer (phosphor sublayer) is preferably 100 to 800 μm, more preferably 120 to 700 μm, in order to obtain a good balance of properties including brightness and sharpness. In order to maintain high brightness and sharpness, the underlying sublayer preferably has a thickness of 0.1 μm to 50 μm, more preferably 5 μm to 40 μm.

Adhesion Layer 13

An adhesion layer is provided between the support and the phosphor layer. One or more of a resin, a metal oxide, and a metal may be used alone or in combination to form the adhesion layer.

Examples of the resin material used to form the adhesion layer include polyurethane, vinyl chloride copolymers, vinyl chloride-vinyl acetate copolymers, vinyl chloride-vinylidene chloride copolymers, vinyl chloride-acrylonitrile copolymers, butadiene-acrylonitrile copolymers, polyamide resins, polyvinyl butyral, polyester, cellulose derivatives (such as nitrocellulose), styrene-butadiene copolymers, various synthetic rubber resins, phenolic resins, epoxy resins, urea resins, melamine resins, phenoxy resins, silicone resins, acrylic resins, and urea formamide resins. In particular, polyurethane, polyester, silicone resins, fluororesins, acrylic resins and polyvinyl butyral are preferably used. A mixture of two or more of these resins may also be used.

The adhesion layer including the resin may also contain a filler. A known inorganic or organic powder may be appropriately selected and used as the filler. Examples of the inorganic powder include powders of titanium oxide, boron nitride, $SnO_2$, $SiO_2$, $Cr_2O_3$, $\alpha$-$Al_2O_3$, $\alpha$-$Fe_2O_3$, $\alpha$-FeOOH, SiC, cerium oxide, corundum, synthetic diamond, garnet, mica, silica, silicon nitride, and silicon carbide. Examples of the organic powder include powders of three-dimensionally crosslinked polymethyl methacrylate, polystyrene, and Teflon (registered trademark). These inorganic powders may have undergone a surface treatment.

Light-scattering particles may also be used as the particulate material. Such particles may be made of $TiO_2$ (anatase-type or rutile-type), MgO, $PbCO_3.Pb(OH)_2$, $BaSO_4$, $Al_2O_3$, M(II)FX (wherein M(II) is at least one atom selected from Ba, Sr, and Ca, and X is a Cl or Br atom), $CaCO_3$, ZnO, $Sb_2O_3$, $SiO_2$, $ZrO_2$, lithopone ($BaSO_4.ZnS$), magnesium silicate, basic silisulfate, basic lead phosphate, aluminum silicate, or other white pigments. These materials may be used in combination with any suitable binder.

Examples of the metal oxide used to from the adhesion layer include $SiO_2$ and $TiO_2$. The metal oxide layer may be composed of two or more oxide layers.

Examples of the metal material used to form the adhesion layer include aluminum, silver, platinum, palladium, gold, copper, iron, nickel, chromium, cobalt, stainless steel, and other metal materials. In view of reflectivity and corrosion resistance, an aluminum- or silver-based metal material is particularly preferred. Two or more of these metal materials may also be used.

A light-absorbing pigment-containing layer may also be used as the adhesion layer. For example, such a layer may include a pigment and a binder resin.

The pigment may be any conventionally known pigment. The pigment is preferably one capable of absorbing red light components in the long-wavelength region, which are more likely to be scattered. The pigment is preferably a blue colorant. Such a blue colorant is preferably, for example, ultramarine blue or prussian blue (iron ferrocyanide). An organic blue pigment may also be used, such as phthalocyanine, anthraquinone, indigoid, or carbonium. Among them, phthalocyanine is preferred in view of the radiation resistance or ultraviolet resistance of the light-absorbing pigment layer.

Examples of the binder resin include polyurethane resins, polyamide resins, polyvinyl butyral, polyester resins, cellulose derivatives (such as nitrocellulose), silicone resins, acrylic resins, vinyl chloride copolymers such as vinyl chloride-vinyl acetate copolymers, vinyl chloride-vinylidene chloride copolymers, and vinyl chloride-acrylonitrile copolymers, various synthetic rubber resins such as butadiene-acrylonitrile copolymers and styrene-butadiene copolymers, phenolic resins, epoxy resins, urea resins, melamine resins, phenoxy resins, urea formamide resins, and other thermosetting resins. Among them, hydrophobic resins such as polyester resins and polyurethane resins are preferred because they have good film adhesion to the support and the phosphor layer formed by vapor deposition. Two or more of the above resins may also be used. In particular, two or more resins with a difference in glass transition temperature (Tg) of 5° C. or more are preferably used, so that the physical properties of the coating film can be easily controlled. In this case, the resins used may be of the same or different types as long as they have different glass transition temperatures.

In this case, the adhesion layer has the function of reflecting fluorescence emitted from the phosphor layer.

The adhesion layer may also absorb fluorescence. The constituent materials are selected as appropriate depending on these purposes. As mentioned above, an object of the adhesion layer is to improve the light extraction efficiency by absorbing or reflecting fluorescence emitted from the phosphor. This makes it possible to form a scintillator with high brightness and sharpness.

When including the resin, the adhesion layer preferably has a thickness of 1 µm to 100 µm, more preferably 1 µm to 60 µm.

When including the metal oxide and the metal, the adhesion layer preferably has a thickness of 0.005 to 0.3 µm, more preferably 0.01 to 0.2 µm, in view of brightness improvement and light extraction efficiency.

Protective Layer

A protective layer may be provided between the adhesion layer 13 and the phosphor layer 12 in order to prevent the adhesion layer 13 from being corroded by the components of the phosphor layer 12.

Specific examples of the material for the protective layer include polyurethane resins, polyamide resins, polyvinyl butyral, polyester resins, cellulose derivatives (such as nitrocellulose), silicone resins, acrylic resins, vinyl chloride copolymers such as vinyl chloride-vinyl acetate copolymers, vinyl chloride-vinylidene chloride copolymers, and vinyl chloride-acrylonitrile copolymers, various synthetic rubber resins such as butadiene-acrylonitrile copolymers and styrene-butadiene copolymers, phenolic resins, epoxy resins, urea resins, melamine resins, phenoxy resins, urea formamide resins, and other thermosetting resins. In particular, polyester resins are preferred.

Heat Shield Layer 14

In the present invention, the heat shield layer 14 is provided to prevent conduction of heat from the photoelectric converter to the phosphor layer.

In the present invention, the material for the heat shield layer and the thickness of the heat shield layer are so selected that C/T is from 0.004 to 5, preferably from 0.004 to 0.7, more preferably from 0.004 to 0.14, wherein T represents the thickness (µm) of the heat shield layer and C represents the thermal conductivity (W/m·K) of the heat shield layer.

The larger the thermal conductivity C, the better the heat transfer. The smaller the thickness T, the better the heat transfer. Therefore, heat shield is made possible by keeping the thermal conductivity C within a specific range, and one-layer heat shield is made possible by keeping the ratio C/T of the thermal conductivity C to the thickness T within a specific range.

The phosphor is partially embedded in the heat shield layer. As defined in FIG. 2, therefore, the shortest distance from the deepest part of the embedded phosphor layer to the surface of the photoelectric converter corresponds to the thickness of the heat shield layer. When the phosphor layer includes columnar crystals, the crystals have pointed fronts. In this case, the heat shield layer does not have to cover the whole of the inclined parts of the columnar crystals as long as it is interposed between the photoelectric converter and the phosphor layer.

Any material may be used to form the heat shield layer as long as the objects of the present invention are not compromised. Any inorganic or organic material capable of forming an optically transparent layer may be used for the heat shield layer.

The heat shield layer preferably has a thermal conductivity C of 5 (W/m·K) or less, more preferably 0.7 (W/m·K) or less, even more preferably 0.14 (W/m·K) or less.

Examples of the inorganic material include graphite, iron, copper, aluminum, magnesium, beryllium, metal-carbon materials such as aluminum-carbon composite materials and copper-carbon composite materials, glass, SiN, $TiO_2$, LiF, $Al_2O_3$, ITO, MgO, and other ceramic materials. As for ceramic materials, a transparent ceramic film such as a commercially available transparent alumina film may be used for the heat shield layer.

Examples of the organic material include polyolefin resins, polyacetal resins, acrylic resins, epoxy resins, polyimide resins, silicone resins, poly(para-xylylene) resins, and other organic resins. The organic material may be thermosetting or thermoplastic.

Specific examples include polyphenylene sulfide resins, fluororesins, polyether ether ketone resins, liquid crystal polymers, polyether nitrile resins, polysulfone resins, polyether sulfone resins, polyarylate resins, polyamide imide resins, polyether imide resins, polyimide resins, epoxy resins, silicone resins, acrylic resins, polyurea resins, polyurethane resins, poly(para-xylylene) resins, polyester resins, polyolefin resins, and polyamide resins.

Among them, polyolefin resins and acrylic resins are preferred as having high optical transparency. Polyolefin resins may include polyethylene, polypropylene, polybutene, ethylene-propylene copolymers, ethylene-butene copolymers, ethylene-vinyl acetate copolymers, ethylene-acrylic acid copolymers, ethylene-acrylate copolymers, ethylene-methacrylic acid copolymers, and ethylene-methacrylate copolymers. Among them, polyethylene is preferred. The acrylic resins may be, for example, polymethylmethacrylate resins. Acrylic resins generally used as pressure-sensitive adhesives may be used. Such acrylic pressure-sensitive adhesives can be used in the form of not only sheets but also fluids. When the acrylic resin is in the form of a sheet, the adhesive may be bonded by a process that includes peeling off one release sheet from the surface of the adhesive, bonding the adhesive surface to the surface of the photoelectric converter, then peeling off the other release sheet from the adhesive surface, and bonding the adhesive surface to the surface of the phosphor. When the acrylic resin is fluid, it can be directly applied and then dried. The epoxy resin may be used in the form of a thermally conductive epoxy adhesive.

The heat shield layer may also be formed using a hot melt sheet. In the present invention, the hot melt sheet is a sheet-shaped adhesive resin including a nonvolatile thermoplastic material that is solid at room temperature and contains no water or solvent (hereinafter referred to as a hot melt resin). The hot melt sheet may be inserted between the materials to be bonded, melted at a temperature equal to or higher than the melting point, and then solidified at a temperature equal to or lower than the melting point, so that the materials can be bonded with the hot melt sheet interposed between. Since the hot melt resin does not contain any polar solvent, solvent, or water, it will not allow a deliquescent phosphor layer to deliquesce even when coming into contact with the phosphor layer. Therefore, the hot melt resin is suitable for the bonding of the phosphor layer. The hot melt sheet is also free of any residual volatile material. Therefore, the hot melt sheet is less shrinkable by drying and has high gap-filling ability and high dimensional stability.

Specifically, the hot melt resin may be based on, for example, a polyolefin resin, a polyamide resin, a polyester resin, a polyurethane resin, an acrylic resin, or an ethylene-vinyl acetate copolymer resin, as a main component. Particularly in view of optical transparency and adhesion, the hot melt resin is preferably based on a polyolefin resin, an ethylene-vinyl acetate copolymer resin, or an acrylic resin.

The method for forming the heat shield layer with such features is selected as appropriate depending on the materials used.

For example, the heat shield layer may be placed on the surface of the photoelectric converter in advance, or the phosphor layer and the photoelectric converter may be stacked with the heat shield layer interposed therebetween.

For example, a film or a foil-shaped structure may be bonded or transferred to form the heat shield layer. Alternatively, the heat shield layer may be formed by a coating technique such as spin coating, screen printing, or dispenser coating.

When the hot melt sheet is used, the hot melt sheet may be inserted between the phosphor layer and the photoelectric converter and then heated under reduced pressure to form the heat shield layer.

The heat shield layer may also be a pressure-sensitive adhesive sheet. Specifically, the pressure-sensitive adhesive sheet may include, for example, an acrylic resin, a urethane resin, a rubber resin, or a silicone resin as a main component. Particularly in view of optical transparency and adhesion, the pressure-sensitive adhesive sheet preferably includes an acrylic resin or a silicone resin as a main component. The pressure-sensitive adhesive sheet can be bonded using a laminator or the like.

In view of heat shielding properties for the phosphor layer, $A_{TP}/A_P$ is preferably from 1.5 to 75, more preferably from 2 to 50, wherein $A_P$ represents the area of a cross-section of the phosphor layer, wherein the cross-section is perpendicular to the direction of incidence of radioactive rays, and $A_{TP}$ represents the contact area between the heat shield layer and the phosphor layer.

As shown in FIG. 2, $A_{TP}/A_P=(L_{TP}/L_P)^2$, wherein $L_{TP}$ represents the length of the contact line between the phosphor part and the non-phosphor part of any exposed surface perpendicular to the plane of incidence or outgoing of rays, and $L_P$ represents the width of the exposed surface (the length of the line parallel to the plane of incidence or outgoing of X-rays).

When the phosphor is in the form of columnar crystals, $A_{TP}$ often differs from $A_P$. In this case, if $A_{TP}/A_P$ is too large, a large area can contribute to thermal conduction, so that the heat shielding properties can be unfavorable as compared with those in the case where the phosphor is not in the form of columnar crystals. On the other hand, if $A_{TP}/A_P$ is too small, the contact area between the scintillator and the heat shield layer can be too small to ensure the adhesion, so that interfacial peeling can occur. Setting $A_{TP}/A_P$ within a specific range makes it possible to provide sufficient heat shielding properties and to prevent interfacial peeling.

The C/T and $A_{TP}/A_P$ ratios can be controlled by appropriately controlling the thickness and composition of the heat shield layer or the conditions for production of the phosphor layer.

Moisture-Resistant Protective Film

The radiographic image detector 10 of the present invention preferably further includes a moisture-resistant protective film provided over its outer circumference. The moisture-resistant protective film has the functions of protecting the whole of the radiographic image conversion panel from moisture and suppressing the degradation of the phosphor layer 12. The moisture-resistant protective film may be, for example, a protective film with low water-vapor permeability or a moisture-resistant film such as a poly(para-xylylene) film.

The protective film may be, for example, a polyethylene terephthalate (PET) film, a polymethacrylate film, a nitrocellulose film, a cellulose acetate film, a polypropylene film, or a polyethylene naphthalate film. Depending on the desired moisture resistance, the moisture-resistant protective film may also include a stack of two or more metal oxide-deposited films each including the protective film and a metal oxide vapor-deposited thereon.

The metal oxide may be, for example, silicon dioxide ($SiO_2$), aluminum oxide ($Al_2O_3$), or ITO.

When a moisture-resistant film such as a poly(para-xylylene) film is formed, the support with the scintillator layer formed thereon may be placed in the vapor deposition chamber of a CVD system and then exposed to a vapor containing sublimated di-para-xylylene, so that the radiographic image detector 10 with the entire surface of the phosphor layer 12 and the support 11 covered with a poly(para-xylylene) film can be obtained.

Photoelectric Converter 15

The photoelectric converter has the functions of absorbing emitted light generated by the phosphor layer, converting the light into charges so that the light is converted into electrical signals, and outputting the electrical signals to the outside of the radiographic image detector. The photoelectric converter may be a conventionally known one.

The photoelectric converter used in the present invention may have any structure. In general, the photoelectric converter has a structure in which a substrate, an image signal output layer, and a photoelectric conversion device are stacked in this order.

In this structure, the photoelectric conversion device has the functions of absorbing light generated by the phosphor layer and converting the light into charges. The photoelectric conversion device may have any specific structure having such functions. For example, the photoelectric conversion device used in the present invention may include a transparent electrode, a charge generation layer capable of being excited by incident light to generate charges, and a counter electrode. All of the transparent electrode, the charge generation layer, and the counter electrode may be those conventionally known in the art. The photoelectric conversion device used in the present invention may include a suitable photosensor. For example, the photoelectric conversion device may include two-dimensionally arranged photodiodes or two-dimensional photosensors such as charge coupled devices (CCDs) or complementary metal-oxide-semiconductors (CMOSs).

The image signal output layer has the functions of storing charges obtained in the photoelectric conversion device and outputting signals based on the stored charges. The image signal output layer may have any specific structure. For example, the image signal output layer may include capacitors, which are charge storage devices for storing, for each pixel, charges generated by the photoelectric conversion device, and transistors, which are image signal output devices for producing output signals from the stored charges. In this case, preferred examples of the transistors include thin film transistors (TFTs).

The substrate functions as a support for the radiographic image detector. The substrate may be the same as the support 11 used in the radiographic image detector 10 of the present invention.

As mentioned above, the photoelectric converter 15 for use in the present invention may have various structures. As shown in the examples described below, for example, the photoelectric converter 15 to be used may include a glass substrate and a plurality of photodiodes and a plurality of TFTs formed on the glass substrate.

The photoelectric converter 15 may further include various units, such as a memory unit for storing image signals based on the information about the intensity and location of X-rays that have been converted into electrical signals, a power supply unit for supplying electric power necessary for driving the photoelectric converter panel 20, and a communication output unit for outputting image information to the outside, which may be the same as those used in the photoelectric converter panel of a known radiographic image detector.

The radiographic image detector according to the present invention may also be combined with a heat dissipation mechanism. The heat dissipation mechanism may be the mechanism described in JP 2014-092447 A or JP 2012-231825 A mentioned above. Alternatively, the heat dissipation mechanism may include an anisotropically thermally conductive, transparent plate including a combination of high and low thermal conductivity layers (JP 2012-141242 A), which is used to form a case for housing the radiographic image detector according to the present invention. Alternatively, the heat dissipation mechanism may include a thermal diffusion layer or sheet (JP 2011-252732 A and JP 2014-81363 A) provided between the support of the radiographic image detector and a reinforcing member in the case. This type of heat dissipation mechanism includes a thermally conductive member, which may be, for example, a heat dissipation unit with a thermal conductivity of 2 mm$^2$/s, such as silicone resin, SUS, or aluminum.

When the heat dissipation mechanism is combined with the heat shield layer provided according to the present invention, thermal conduction to the phosphor can be further suppressed so that temperature quenching can be further suppressed.

The radiographic image detector of the present invention, in which heat from the circuit board to the phosphor layer is shielded, can be used in combination with video techniques.

In video recording, successive images are taken while radioactive rays are continuously applied to a radiographic imaging device through the object. In this case, electric circuits and other components can generate intense heat whereas dissipation and diffusion of heat from any heat dissipation mechanism and other components often cannot keep up with the generation of heat, so that temperature quenching of the phosphor can have a large influence. In the present invention where the heat shield layer is provided, however, the phosphor is less influenced by the temperature, so that a reduction in the amount of emitted light or variations in brightness can be prevented from occurring to such an extent that image quality degradation occurs, for example, even when successive images are taken at a rate of one per second or more.

Method of Producing Radiographic Image Detector

The radiographic image detector 10 according to the present invention can be obtained, for example, as follows. If necessary, an adhesion layer 13 and a protective layer are formed on a support 11 by conventionally known methods. Subsequently, a phosphor layer 12 is formed thereon, and then a photoelectric converter is placed on the phosphor layer 12 with a heat shield layer interposed therebetween. If necessary, a moisture-resistant protective film is formed by a conventionally known method, so that the radiographic image detector 10 is obtained.

The phosphor is preferably formed by a gas phase method. Specifically, the phosphor is preferably formed by vapor deposition.

In a preferred mode of the production method, the phosphor layer is formed by a vapor phase deposition method including the steps of: mounting a support on a support rotation mechanism in a vapor deposition system having a vapor source and the support rotation mechanism in a vacuum chamber; and vapor-depositing a phosphor material on the support while the support is rotated.

Bonding to Photoelectric Detector

The phosphor layer and the photoelectric converter are stacked with the heat shield layer interposed therebetween. For example, a heat shield layer-forming sheet may be placed between the phosphor layer and the photoelectric converter and then heated under pressure so that a heat shield layer can be formed having a desired thickness on the surface of the phosphor layer and having a desired contact area with the columnar crystals of the phosphor layer.

A hot melt resin sheet is preferably used to form the heat shield layer. Removable protective layers may be provided on both surfaces of the hot melt resin sheet. After the protective layers are removed, the hot metal resin sheet may be subjected to a heating process so that it can be bonded to the object.

<Applications>

The radiographic image detector of the present invention can be used for various types of X-ray imaging systems. The radiographic image detector of the present invention can be used for not only still imaging but also seriography. Therefore, the radiographic image detector of the present invention can be used as a radiographic video image detector.

EXAMPLES

Hereinafter, the present invention will be more specifically described with reference to examples, which, however, are not intended to limit the present invention.

Production Examples

A 125-μm-thick polyimide film (UPILEX-125S manufactured by Ube Industries, Ltd.) was used as a support. A 3-μm-thick coating of VYLON RESIN (manufactured by TOYOBO CO., LTD.), crystalline polyester, was formed as an adhesion layer on the surface of the support, where a phosphor was to be deposited. The coated support was then cut to form a support for vapor deposition. A CsI phosphor was vapor-deposited on the resulting support in vacuo under the conditions described in JP 2015-021886 A. The vapor deposition was completed when the thickness of the CsI film reached 200 μm.

Examples 1 to 25 and Comparative Examples 1 to 5

Using each material shown in the tables below, a heat shield layer was formed as described below.

Transparent Alumina Film

A commercially available alumina thin film with a desired thickness was placed on the photoelectric converter at the surface of PaxScan (2520 FPD manufactured by Varian Medical Systems, Inc.) and then bonded to the phosphor by being pressed against the surface of the phosphor. The bonding was performed by the application of stress, and therefore, any adhesive containing any material other than alumina was not used.

ITO (Tin-Doped Indium Oxide)

A commercially available ITO dispersion was mixed with a binder resin. The mixture was applied to a temporary support and then dried to form an ITO-containing transparent film. The ITO-containing transparent film alone or a laminate including ITO-containing transparent film was placed on the photoelectric converter at the surface of PaxScan (2520 FPD manufactured by Varian Medical Systems, Inc.) and then bonded to the phosphor by being pressed against the surface of the phosphor. The bonding was performed by the application of stress, and therefore, any adhesive containing any material other than ITO was not used.

Epoxy Resin

A commercially-available thermally-conductive epoxy adhesive was used as the epoxy resin. The epoxy adhesive was applied to the photoelectric converter at the surface of PaxScan (2520 FPD manufactured by Varian Medical Systems, Inc.) and then dried to form an epoxy resin layer with the thickness shown in Table 1, which was then bonded to the surface of the phosphor.

Polyethylene Resin

A commercially-available low-density polyethylene film was used. One surface of the polyethylene film was bonded to the photoelectric converter at the surface of PaxScan (2520 FPD manufactured by Varian Medical Systems, Inc.), and the other surface of the polyethylene film was bonded to the phosphor by being pressed against the surface of the phosphor. The bonding was performed by the application of stress, and therefore, any adhesive containing any material other than polyethylene was not used.

Acrylic Resin

A commercially available acrylic pressure-sensitive adhesive sheet was used. After the release sheet was removed from one surface of the adhesive sheet, the exposed surface of the adhesive sheet was bonded to the surface of the photoelectric converter at the surface of PaxScan (2520 FPD manufactured by Varian Medical Systems, Inc.). Subsequently, after the other release sheet was removed, the exposed surface of the adhesive sheet was bonded to the surface of the phosphor.

Polyolefin Resin

A polyolefin film with a predetermined thickness was used. After one surface of the polyolefin film was bonded to the photoelectric converter at the surface of PaxScan (2520 FPD manufactured by Varian Medical Systems, Inc.), the other surface of the polyolefin film was bonded to the surface of the phosphor.

Poly(Para-Xylylene) Resin

The support with the phosphor layer formed thereon was placed in the vapor deposition of a CVD system and then exposed to a vapor containing sublimated di-para-xylylene, so that the entire surface of the phosphor layer was coated with a poly(para-xylylene) film with a predetermined thickness. The poly(para-xylylene) film was then bonded to the photoelectric converter at the surface of PaxScan (2520 FPD manufactured by Varian Medical Systems, Inc.).

Evaluation Items:

The radiographic image detector prepared in each of the examples and the comparative examples was evaluated for $A_{TP}/A_P$, brightness, brightness unevenness, and image sharpness using the criteria shown below.

$A_{TP}/A_P$

Before brought into contact with or bonded to the photoelectric conversion layer, the panel was cut so that a certain surface of the panel was exposed perpendicular to the plane of incident or outgoing of X-rays. A scanning electron micrograph was taken of the exposed cross-sectional surface while modulation was performed with image processing software in such a way that the phosphor and non-phosphor parts of the micrograph could be distinguished from each other. In this procedure, the length $L_{TP}$ of the contact line between the phosphor and non-phosphor parts in the exposed surface and the width $L_P$ of the exposed surface (the length of the line parallel to the plane of incidence or outgoing of X-rays) were determined and used to calculate $A_{TP}/A_P$ assuming that $A_{TP}/A_P=(L_{TP}/L_P)^2$.

The evaluation criteria are as follows. The $A_{TP}/A_P$ value in the range of 1.5 to 75 is rated as "○" (favorable), and the $A_{TP}/A_P$ value out of the range of 1.5 to 75 is rated as "X" (not favorable).

Brightness

X-rays were applied to the FPD at a tube voltage of 80 kVp. The average signal value of the resulting image data was determined as the amount of emitted light.

Since the properties significantly varied depending on the thickness of the phosphor layer, relative evaluation was performed for the same phosphor layer thickness.

The evaluation criteria are as follows. The amount of emitted light in Example 15 is normalized to a brightness of 1.0. A brightness 0.8 times to less than 1.2 times that in Example 15 is rated as "○" (good). A brightness 1.2 times or more that in Example 15 is rated as "⊙" (very good). A brightness 0.6 times to less than 0.8 times that in Example 15 is rated as "Δ" (fair). A brightness less than 0.6 times that in Example 15 is rated as "X" (poor).

Brightness Unevenness

Brightness unevenness listed in Table 1 was evaluated as follows. A signal value difference was determined between the largest and smallest signal parts of the image taken for the evaluation of brightness (before flat correction). The ratio of the signal value difference to the average signal value of the entire panel was calculated. A ratio of 20% or more is rated as "X" (poor), a ratio of 10% to less than 20% as "Δ" (fair), a ratio of 5% to less than 10% as "○" (good), and a ratio of less than 5% as "⊙" (very good).

Sharpness

Using an X-ray irradiator with the tube voltage set to 80 kVp, the back side of the phosphor (the surface on which no phosphor layer was formed) was irradiated with X-rays through a lead MTF chart. The image data detected by the flat panel was stored on a hard disk. Subsequently, the image data stored on the hard disk was analyzed with a computer, in which the modulator transfer function MTF (MTF value at a special frequency of 1 cycle/mm) of the X-ray image stored on the hard disk was used as a measure of sharpness.

Relative evaluation was performed using the MTF value of Example 15 as a standard value. An MTF value less than 0.5 times the standard value is rated "X" (poor), an MTF value 0.5 times to less than 0.9 times the standard value is rated as "Δ" (fair), and an MTF value 0.9 times or more the standard value is rated as "○" (good).

Table 1 also shows the results.

TABLE 1

| | Heat shield layer | | | | | | Image quality rating (sharpness) |
|---|---|---|---|---|---|---|---|
| | Material | Thermal conductivity [W/m·K] | Thickness [μm] | C/T | $A_{TP}/A_P$ | Brightness rating | Brightness unevenness rating | |
| Example 1 | Transparent alumina | 34 | 10 | 3.400 | X | X | Δ | — |
| Example 2 | ITO | 2.5 | 10 | 0.250 | ○ | Δ | ○ | — |
| Example 3 | ITO | 2.5 | 5 | 0.500 | ○ | Δ | ○ | — |
| Example 4 | ITO | 2.5 | 1 | 2.500 | ○ | Δ | Δ | — |
| Example 5 | Epoxy resin | 1.6 | 10 | 0.160 | ○ | Δ | ○ | — |
| Example 6 | Epoxy resin | 1.6 | 5 | 0.320 | ○ | Δ | ○ | — |
| Example 7 | Epoxy resin | 1.6 | 3 | 0.533 | ○ | Δ | ○ | — |
| Example 8 | Epoxy resin | 1.6 | 2 | 0.800 | ○ | Δ | Δ | — |
| Example 9 | Epoxy resin | 1.6 | 1 | 1.600 | ○ | Δ | Δ | — |
| Example 10 | Polyethylene | 0.33 | 10 | 0.033 | ○ | ○ | ⊙ | ○ |
| Example 11 | Polyethylene | 0.33 | 5 | 0.066 | ○ | ○ | ⊙ | ○ |
| Example 12 | Polyethylene | 0.33 | 3 | 0.110 | ○ | ○ | ⊙ | ○ |
| Example 13 | Polyethylene | 0.33 | 2 | 0.165 | ○ | ○ | ○ | — |
| Example 14 | Polyethylene | 0.33 | 1 | 0.330 | ○ | ○ | ○ | — |
| Example 15 | Acrylic resin | 0.21 | 10 | 0.021 | ○ | ○ | ⊙ | ○ |
| Example 16 | Acrylic resin | 0.21 | 5 | 0.042 | ○ | ○ | ⊙ | ○ |
| Example 17 | Acrylic resin | 0.21 | 2 | 0.105 | ○ | ○ | ⊙ | ○ |
| Example 18 | Acrylic resin | 0.21 | 1 | 0.210 | ○ | ○ | ○ | — |
| Example 19 | Polyolefin resin | 0.12 | 20 | 0.006 | ○ | ⊙ | ⊙ | ○ |
| Example 20 | Polyolefin resin | 0.12 | 10 | 0.012 | ○ | ⊙ | ⊙ | ○ |
| Example 21 | Polyolefin resin | 0.12 | 5 | 0.024 | ○ | ⊙ | ⊙ | ○ |
| Example 22 | Polyolefin resin | 0.12 | 1 | 0.120 | ○ | ⊙ | ⊙ | ○ |
| Example 22 | Poly(para-xylylene) | 0.084 | 20 | 0.004 | ○ | ⊙ | ⊙ | Δ |
| Example 23 | Poly(para-xylylene) | 0.084 | 10 | 0.008 | ○ | ⊙ | ⊙ | ○ |
| Example 24 | Poly(para-xylylene) | 0.084 | 5 | 0.017 | ○ | ⊙ | ⊙ | ○ |
| Example 25 | Poly(para-xylylene) | 0.084 | 1 | 0.084 | ○ | ⊙ | ⊙ | ○ |
| Comparative Example 1 | Transparent alumina | 34 | 1 | 34.000 | X | X | X | — |
| Comparative Example 2 | Transparent alumina | 34 | 0.5 | 68.000 | X | X | X | — |
| Comparative Example 3 | ITO | 2.5 | 0.5 | 5.000 | ○ | Δ | X | — |
| Comparative Example 4 | Polyolefin resin | 0.12 | 40 | 0.003 | ○ | ⊙ | ⊙ | X |
| Comparative Example 5 | Poly(para-xylylene) | 0.084 | 40 | 0.002 | ○ | ⊙ | ⊙ | X |

Examples 26 to 30 and Comparative Examples 6 and 7

A 10-μm-thick heat shield layer was formed using the acrylic resin shown above. In this process, $A_{TP}/A_P$ was intentionally controlled to the value shown in Table 2. The control of $A_{TP}/A_P$ was performed by appropriately controlling the temperature and the force applied during the bonding of the heat shield layer, the time of the application of the force, the thickness of the heat shield layer, the number of the heat shield layers (when the heat shield was in the form of a sheet), the number of times of coating (when the heat shield material was fluid), and other conditions.

Table 2 also shows the results. It was not possible to evaluate sharpness in Comparative Examples 6 and 7 where the brightness unevenness was large.

TABLE 2

| | Heat shield layer | | | | | | Image quality rating (sharpness) |
|---|---|---|---|---|---|---|---|
| | Material | Thermal conductivity [W/m·K] | Thickness [μm] | C/T | $A_{TP}/A_P$ | Brightness rating | Brightness unevenness rating | |
| Example 26 | Acrylic resin | 0.21 | 10 | 0.021 | 1.5 | ○ | Δ | ○ |
| Example 27 | | | | | 2 | ○ | ⊙ | ○ |
| Example 28 | | | | | 10 | ○ | ⊙ | ○ |
| Example 29 | | | | | 50 | ○ | ⊙ | ○ |
| Example 30 | | | | | 75 | ○ | Δ | Δ |
| Comparative Example 6 | | | | | 1.2 | ○ | X | — |
| Comparative Example 7 | | | | | 100 | ○ | X | — |

According to an embodiment of the present invention, a heat shield layer is so formed that the material, thickness, and $A_{TP}/A_P$ ratio of the heat shield layer satisfy specified relationships, which makes it possible to obtain a radiographic image detector capable of forming images with high brightness, high sharpness, and reduced unevenness in brightness.

According to an embodiment of the present invention, a specific heat shield layer provided between a phosphor layer and a photodetector can shield heat generated from a circuit board, the photodetector, and other components, so that temperature quenching of a scintillator can be suppressed, which makes it possible to reduce the image quality degradation associated with a reduction in the amount of light emitted from the phosphor layer and to reduce the image quality degradation caused by unevenness in the in-plane brightness of the phosphor layer.

In this case, there is no need to use a correction unit such calibration, so that the entire system can be simplified and the need for preparing a program necessary for correction can be eliminated. Even if a correction unit is necessary, uncorrectable images can also be controlled, so that the accuracy of correction can be improved.

Although the present invention has been described and illustrated in detail, it is clearly understood that the same is by way of illustrated and example only and is not to be taken byway of limitation, the scope of the present invention being interpreted by terms of the appended claims.

What is claimed is:

1. A radiographic image detector comprising a phosphor layer, a heat shield layer, and a photoelectric converter in this order, wherein the heat shield layer has a thickness T (μm) and a thermal conductivity C (W/m·K) satisfying that C/T is from 0.004 to 5.

2. The radiographic image detector according to claim 1, wherein C/T is from 0.004 to 0.7.

3. The radiographic image detector according to claim 1, wherein C/T is from 0.004 to 0.14.

4. The radiographic image detector according to claim 1, wherein the heat shield layer has a thermal conductivity C of at most 5 (W/m·K).

5. The radiographic image detector according to claim 4, wherein the heat shield layer has a thermal conductivity C of at most 0.7 (W/m·K).

6. The radiographic image detector according to claim 4, wherein the heat shield layer has a thermal conductivity C of at most 0.14 (W/m·K).

7. The radiographic image detector according to claim 1, which has an $A_{TP}/A_P$ ratio of 1.5 to 75, wherein $A_P$ represents the area of a section of the phosphor layer, wherein the section is perpendicular to the direction of incidence of radioactive rays, and $A_{TP}$ represents the contact area between the heat shield layer and the phosphor layer.

8. The radiographic image detector according to claim 1, wherein the heat shield layer comprises a hot melt resin as a main component.

9. The radiographic image detector according to claim 8, wherein the hot melt resin comprises at least one selected from a polyolefin resin, an ethylene-vinyl acetate copolymer, and an acrylic resin.

10. The radiographic image detector according to claim 1, which is capable of detecting an image at a rate of at least one per second.

* * * * *